United States Patent
Morita et al.

(10) Patent No.: US 7,651,887 B2
(45) Date of Patent: *Jan. 26, 2010

(54) OPTICAL SEMICONDUCTOR DEVICE AND METHOD OF MANUFACTURING THEREOF

(75) Inventors: Yoshitsugu Morita, Chiba (JP); Tomoko Kato, Chiba (JP)

(73) Assignee: Dow Corning Toray Company, Ltd., Tokyo (JP)

( * ) Notice: Subject to any disclaimer, the term of this patent is extended or adjusted under 35 U.S.C. 154(b) by 69 days.

This patent is subject to a terminal disclaimer.

(21) Appl. No.: 11/575,835

(22) PCT Filed: Sep. 15, 2005

(86) PCT No.: PCT/JP2005/017443

§ 371 (c)(1),
(2), (4) Date: Mar. 22, 2007

(87) PCT Pub. No.: WO2006/033375

PCT Pub. Date: Mar. 30, 2006

(65) Prior Publication Data

US 2008/0070333 A1    Mar. 20, 2008

(30) Foreign Application Priority Data

Sep. 22, 2004    (JP) .............................. 2004-276078

(51) Int. Cl.
*H01L 21/20* (2006.01)
(52) U.S. Cl. ....................... 438/106; 438/110; 438/126; 438/127
(58) Field of Classification Search .................. 438/26, 438/106, 126, 127, 65, 110, 112, 264, 725; 257/E23.018, 65, 66, E23.129, 31.118, 33.059
See application file for complete search history.

(56) References Cited

U.S. PATENT DOCUMENTS 3,759,867 A    9/1973    Merrill et al.

(Continued)

FOREIGN PATENT DOCUMENTS

EP    0625548 A2    11/1994

(Continued)

OTHER PUBLICATIONS

English language translation and abstract for JP08-176447 extracted from *Searching PAJ* database dated Dec. 9, 2007, 28 pages.

(Continued)

*Primary Examiner*—Michael S Lebentritt
(74) *Attorney, Agent, or Firm*—Howard & Howard Attorneys PLLC

(57) ABSTRACT

A method of manufacturing an optical semiconductor device (16) sealed in a transparent or semitransparent cured silicone body (50) by placing an unsealed optical semiconductor device (16) into a mold (23, 34) and subjecting a transparent or semitransparent curable silicone composition (50) that fills the spaces between the mold and the unsealed device (70) to compression molding; provides the sealed optical semiconductor device that is free of voids, allows control of the coating layer thickness, protects the bonding wires from breakage and accidental contact, reduces concentration of stress on an optical semiconductor element, has long service life with reducing discoloration and disconnection of the sealing resin from the optical semiconductor element (16), and has excellent reliability.

11 Claims, 3 Drawing Sheets

U.S. PATENT DOCUMENTS

| | | | |
|---|---|---|---|
| 4,005,457 A * | 1/1977 | Hill et al. ................. 257/99 |
| 4,843,280 A | 6/1989 | Lumbard et al. |
| 5,618,631 A | 4/1997 | Meguriya et al. |
| 5,645,941 A | 7/1997 | Meguriya et al. |
| 5,714,265 A | 2/1998 | Meguriya et al. |
| 5,859,127 A | 1/1999 | Nakano et al. |
| 6,121,675 A * | 9/2000 | Fukamura et al. ........... 257/680 |
| 6,187,243 B1 * | 2/2001 | Miyajima ............ 264/272.15 |
| 6,235,862 B1 | 5/2001 | Isshiki et al. |
| 6,344,162 B1 * | 2/2002 | Miyajima ............ 264/272.14 |
| 6,372,398 B1 * | 4/2002 | Yamada et al. ............. 430/66 |
| 6,376,057 B1 * | 4/2002 | Akao et al. ............. 428/215 |
| 6,437,090 B1 * | 8/2002 | Murai et al. ............. 528/416 |
| 6,509,423 B1 * | 1/2003 | Zhu ........................ 525/478 |
| 6,511,620 B1 * | 1/2003 | Kawahara et al. ......... 264/40.5 |
| 6,617,400 B2 * | 9/2003 | Yeager et al. ............. 525/533 |
| 6,733,190 B2 * | 5/2004 | Kuhara et al. ............. 385/94 |
| 6,808,804 B2 * | 10/2004 | Hotaka et al. ............. 428/357 |
| 7,056,772 B2 * | 6/2006 | Shiobara et al. ........... 438/127 |
| 2002/0015748 A1 * | 2/2002 | Miyajima et al. ............ 425/89 |
| 2002/0028335 A1 | 3/2002 | Fujiki et al. |
| 2004/0257191 A1 | 12/2004 | Muller |
| 2007/0176317 A1 * | 8/2007 | Morita et al. ............. 264/138 |

FOREIGN PATENT DOCUMENTS

| | | |
|---|---|---|
| EP | 1002834 A1 | 5/2000 |
| EP | 1424363 * | 11/2003 |
| EP | 1424363 A1 | 11/2003 |
| GB | 2279616 A | 1/1995 |
| JP | 57002583 | 1/1982 |
| JP | 58162660 | 9/1983 |
| JP | 4293962 | 10/1992 |
| JP | 08-176447 | 7/1996 |
| JP | 08-244064 | 9/1996 |
| JP | 09-107128 | 4/1997 |
| JP | 11012546 | 1/1999 |
| JP | 11-077733 | 3/1999 |
| JP | 2000-277551 | 10/2000 |
| JP | 2003-008082 | 1/2003 |
| JP | 2004-043814 | 2/2004 |
| JP | 2004-043815 | 2/2004 |
| WO | WO 02/097393 A3 | 12/2002 |
| WO | WO 03/028060 A1 | 4/2003 |
| WO | WO 2005/021652 A1 | 3/2005 |

OTHER PUBLICATIONS

English language translations and abstract for JP 08-244064 extracted from *Searching PAJ* database dated May 29, 2008, pp. 34.
English language translations and abstract for JP 09-107128 extracted from *Searching PAJ* database dated May 29, 2008, pp. 42.
English language translations and abstract for JP 11-077733 extracted from *Searching PAJ* database dated May 29, 2008, pp. 28.
English language translation and abstract for JP 2003-008082 extracted from *Searching PAJ* database dated May 28, 2008, 47 pp.
English language translation and abstract for JP2004-043814 extracted from *Searching PAJ* database dated Dec. 16, 2007, 51 pp.
English language translation and abstract for JP2004-043815 extracted from *Searching PAJ* database dated Dec. 9, 2007, 21 pp.
English language abstract for JP 4293962 extracted from espacenet.com database dated Feb. 22, 2007.
English language abstract for JP 57002583 extracted from espacenet.com database dated May 28, 2008.
English language abstract for JP 58162660 extracted from espacenet.com database dated Feb. 22, 2007.
English language abstract for JP 11012546 extracted from espacenet.com database dated Dec. 16, 2007.
English language abstract for WO 03/028060 A1.
PCT International Search Report for PCT/JP2005/011864, Jan. 20, 2006, 5 pages.
PCT International Search Report for PCT/JP2005/011576, Jan. 4, 2006, 4 pages.
PCT International Search Report for PCT/JP2005/024196, Mar. 20, 2006, 3 pages.
PCT International Search Report for PCT/JP2006/306996, Jul. 18, 2006, 3 pages.
PCT International Search Report for PCT/JP2005/018405, Mar. 22, 2006, 6 pages.
Yongxin Han et al. "Silicon Directed *ipso*-Substitution of Polymer Bound Arylsilanes: Preparation of Biaryls via", Tetrahedron Letters, vol. 37, No. 16. 1996, pp. 2703-2706.
Schultz et al., "The Synthesis Of Trimethylsilylmethoxymethyl Chloride", OPPI Briefs, vol. 27, No. 5, 1995, pp. 572-574.
Hojo et al., "New Access To Carbonyl Ylides By The Silicon-Based 1,3-Elimination and Their: . . . ", Tetrahedron Letters, vol. 34, No. 37, 1993, pp. 5943-5946.
Boons et al., "Use of (Phenyldimethylsilyl)methoxymethyl and (Phenyldimethylsilyl)methyl ethers . . . ", Tetrahedron Letters, vol., 31, No. 15, 1990, pp. 2197-2200.
Hasseberg et al., "104. Synthese von Orellin", Helvetica Chimica Acta—vol. 71, No. 5, 1988, pp. 957-963.
Guedin-Vuong et al., "An Easy Access To Homopropargylic Ethers", Bulletin De La Societe Chimique De France, No. 2, 1986, pp. 245-252.
Pyne et al., "Chiral and Stereochemical Control via Intramolecular Diels-Alder Reaction of Z Dienes", J. American Chemical Society, vol. 104, No. 21, 1982, pp. 5719-5728.
Lipshutz et al., "B-(Trimethylylsilyl) Ethoxymethyl Chloride . . . ," Tetrahedron Letters, vol. 21, No. 35, 1980, pp. 3343-3346.
Shikhiev et al., "Synthesis and Reactions of Unsaturated Organosilicon Compounds", J. Of General Chemistry of the USSR, vol. 41, No. 3, 1971, pp. 617-619.
Shipov et al., "Synthesis of Alkyl Chloromethyl Ethers", J. Of General Chemistry of the USSR, vol. 59, No. 5.2, 1989, p. 1067.
Miramon et al., "Short Synthesis of Polyoxygenated Macrocyclic . . . ", Journal of Organic Chemistry, vol. 69, No. 20, 2004, pp. 6949-6952.
Shikhiev et al., "Synthesis and Reactions of Some Heteroorganic Ethers . . . ", J. Of General Chemistry of the USSR, vol. 45, No. 1, 1975, pp. 91-93.
English language abstract for JP2000277551 extracted from espacenet.com May 28, 2008.

* cited by examiner

OPTICAL SEMICONDUCTOR DEVICE AND METHOD OF MANUFACTURING THEREOF

RELATED APPLICATIONS

This application claims priority to and all the advantages of International Patent Application No. PCT/JP2005/017443, filed on Sep. 15, 2005, which claims priority to Japanese Patent Application No. JP2004-276078, filed on Sep. 22, 2004.

TECHNICAL FIELD

This invention relates to a method of manufacturing an optical semiconductor device and to an optical semiconductor device produced by the method.

BACKGROUND ART

Several methods are known for sealing optical semiconductor devices such as, e.g., light-emitting diodes, in resin. A casting molding method consists of pouring a liquid thermosetting or UV-curable resin into a mold, inserting a lead frame carrying a light-emitting diode element connected by means of bonding wires to the frame, and then curing the resin by heating or UV radiation. An injection molding method consists of melting a thermoplastic resin in the cylinder of an injection molding machine, injecting the resin under pressure into a cavity of a mold in which a lead frame carrying a light-emitting diode element connected by means of bonding wires to the frame was inserted, and then curing the resin. According to another method that is known as a transfer molding process, pressure is applied to liquefy a B-stage resin which is stopped in the middle of the curing reaction, a lead frame carrying a light-emitting diode element connected by means of bonding wires to the frame is inserted in a mold, and the resin was supplied into the mold, and then the resin is cured by heating (see Japanese Laid-Open Patent Application Publication (Kokai) (hereinafter referred to as "Kokai") Sho 54-19660, Kokai Sho 57-2583, Japanese Examined Patent Application Publication Hei 4-40870, Kokai Hei 9-107128, and Kokai 2003-8082).

At the present time, sealing of light-emitting diodes is normally carried out with the use of a thermosetting resin, such as an epoxy resin. However, an increase in intensity of light emitted by such optical semiconductor device and operation of the device in a continuous mode change the color of the cured body of the sealing resin and decrease reliability of the device. Normally, sealing of light-emitting diodes is carried out by casting molding. However, the casting molding method is associated with a number of problems such as low production efficiency caused by slow curing of thermosetting resins, need for the use of several jigs for positioning of the resin sealing unit and lead frame that may lead to formation of defects in the obtained light-emitting diodes, possibility of development of dry spots on the surfaces caused by shrinkage at curing of thermosetting resins, formation of voids in the sealing resin, and separation of the sealing resin from the light-emitting diode element that may be caused by concentration of curing stress on the light-emitting diode element.

The transfer molding method is advantageous in that this method allows accurate control of thickness in the sealing resin layer. Disadvantages of the transfer molding method consist of the following: variations of pressure in the sealing resin flow may deform, break or create undesired contact of bonding wires that are used for electrical connection of the light-emitting diode; the method may require the use of cooling means needed to stop curing of aforementioned thermosetting B-stage resin during storage and transportation thereof; and extra cost associated with the factors mentioned above.

On the other hand, advantages of injection molding method reside in the fact that a light emitting diode element is placed directly into the mold, the lead frame connected to the light emitting diode element is fixed directly in the mold, a smaller number of molds may be needed for production, the obtained light emitting diodes have smaller deviations in properties, the products are to a lesser degree subject to formation of defects, and do not develop dry spots caused by shrinkage at curing. Nevertheless, injection molding may cause breakage and undesirable contact of bonding wires that are used for electrical connection of light emitting diodes elements.

It is an object of the present invention to provide a method of sealing optical semiconductor devices, such as, e.g., light-emitting diodes, that does not form voids in the sealing material, allows accurate control of thickness in a sealing resin layer, does not cause breakage or undesired contacts of bonding wires, is characterized by low concentration of stress in optical semiconductor device elements, reduces chance of discoloration of the sealing resin and disconnection of the sealing resin from the optical semiconductor device elements, even after long use or after operation at increased intensity of light generation, and is suitable for industrial production of optical semiconductor devices of high reliability. It is another object to provide a sealed optical semiconductor device that even after a long use possesses excellent reliability, and is not subject to discoloration of the sealing resin layer and to decrease in the brightness of the generated light that may be caused by peeling of the sealing resin layer from the light-emitting semiconductor element.

DISCLOSURE OF INVENTION

The invention provides a method of manufacturing an optical semiconductor device sealed in a transparent or semitransparent cured silicone body by placing an unsealed optical semiconductor device into a mold and subjecting a transparent or semitransparent curable silicone composition that fills the spaces between the mold and the unsealed semiconductor device to compression molding.

In addition, the invention also provides an optical semiconductor device produced by the aforementioned method.

EFFECTS OF INVENTION

The method of the invention for sealing optical semiconductor devices, such as, e.g., light-emitting diodes, makes it possible to prevent formation of voids in the sealing material, allows accurate control of thickness in a sealing resin layer, does not cause breakage or undesired contacts of bonding wires, is characterized by low concentration of stress on optical semiconductor device elements, reduces chance of discoloration of the sealing resin and disconnection of the sealing resin from the optical semiconductor device elements even after long use or after operation at increased intensity of light generation, and is suitable for industrial production of optical semiconductor devices of high reliability. Furthermore, the sealed optical semiconductor device of the invention possesses, even after a long use, excellent reliability and is not subject to discoloration of the sealing resin layer and to decrease in brightness of generated light that may be caused by peeling of the sealing resin layer from the light-emitting semiconductor element.

Figure 1:
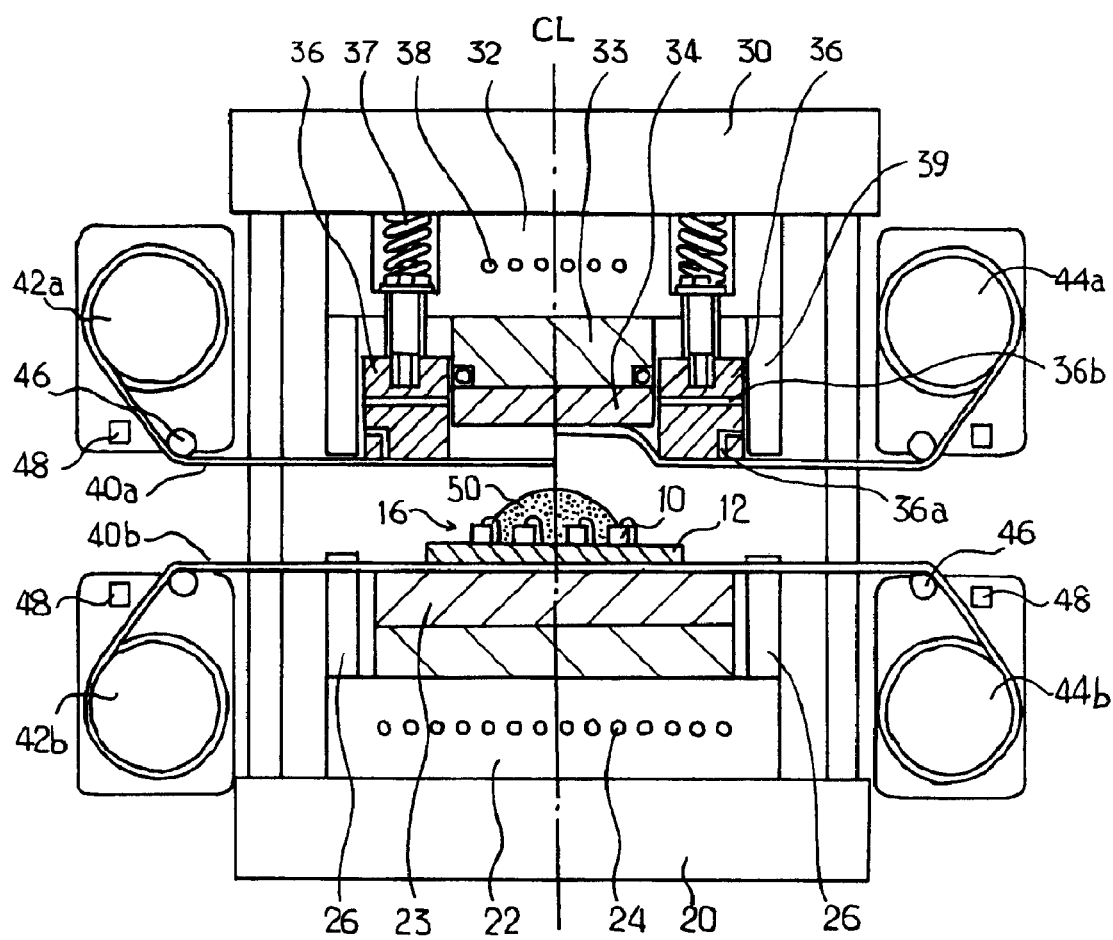
FIG. 1 illustrates main structural units of compression molding machine suitable for realization of the method of the invention.

| Reference numbers | |
|---|---|
| 10: | Optical semiconductor element |
| 12: | Printed circuit board |
| 16: | Optical semiconductor device |
| 20: | Fixed platen |
| 22: | Lower base |
| 23: | Lower mold |
| 24: | Heater |
| 26: | Lower clamp stopper |
| 30: | Movable platen |
| 32: | Upper base |
| 33: | Upper holder |
| 34: | Upper mold |
| 34a: | Recess of the cavity |
| 36: | Clamper |
| 36a, 36b: | Air ports |
| 37: | Spring |
| 38: | Heater |
| 39: | Upper clamp stopper |
| 40a, 40b: | Release films |
| 42a, 42b: | Feed rollers |
| 44a, 44b: | Take-up rollers |
| 46: | Guide roller |
| 48: | Static charge remover |
| 50: | Curable silicone composition |
| 70: | Optical semiconductor device sealed with a cured silicone body |
| 72: | Cured silicone body |

DETAILED DESCRIPTION OF THE INVENTION

The following is a more detailed description of the method of the invention for manufacturing a sealed optical semiconductor device.

According to the method of the invention, an unsealed optical semiconductor device is placed into a mold and is then sealed in a transparent or semitransparent cured silicone body by filling spaces between the mold and the optical semiconductor device with a transparent or semitransparent curable silicone composition and subjecting the composition to compression molding. A compression molding machine that contains the aforementioned mold may be represented by a conventional compression molding machine comprised: an upper mold and a lower mold between which an unsealed optical semiconductor device can be clamped and a curable silicone composition can be fed for filling the cavities between the mold and the semiconductor device for subsequent compression molding; a damper for application of pressure to the upper and lower molds; and a heater for curing the curable silicone composition by heating. Such compression molding machines are disclose, e.g., in Kokai Hei 8-244064, Kokai Hei 11-77733, and Kokai 2000-277551. In view of its simplicity, let us consider, e.g., the compression molding machine disclosed in Kokai 2000-277551 is preferable.

More specifically, the compression molding machine disclosed in Kokai 2000-277551 makes it possible to place an unsealed optical semiconductor device into a lower mold, supply a transparent or semitransparent curable silicone composition into spaces between the upper mold and the unsealed optical semiconductor device, to clamp the semiconductor device between the upper mold and lower mold, and to subject the curable silicone composition to compression molding. The aforementioned machine has a damper made in the form of a frame that encloses side faces of the sealing area of the upper mold. The damper is supported so that it can freely move vertically in the direction of closing-opening of the mold along the aforementioned side faces and so that, when the mold is open, the clamper's lower end face projects from the molding face of the upper mold and is biased to the lower mold. When the lower mold or upper mold is in direct contact with the curable liquid silicone composition, its molding surfaces can be easily coated with a fluoro-resin composition. In particular, the aforementioned compression molding machine is provided with a device for feeding a film peelable from the mold and the silicone cured body to positions where it can cover the sealing area of the upper mold. In such a machine, sealing of the unsealed optical semiconductor device via the release film protects the silicone cured body from sticking to the molding surface of the mold, reliably closes the sealing area, and prevents formation of burrs.

The aforementioned compression molding machine may also be provided with a feeding mechanism for feeding the film peelable from the mold and cured silicone body to a position where it can cover the molding surface that may support the optical semiconductor device in the lower mold. Furthermore, the machine is equipped with an air suction mechanism that applies a suction action to the release film on the lower end face of the clamper and to the release film on the inner surface of the sealing area by sucking air from the inner bottom surface of the curable silicone composition sealing area formed by the inner face of the damper and the molding surface of the upper mold. A provision of the aforementioned suction mechanism reliably holds and seals the release film on the molding surfaces. Alternatively, a suction mechanism for holding the release film may be comprised of air ports open to the lower end face of the damper and air ports that communicate with an air flow formed in the space between the inner side surface of the damper and the side surface of the upper mold. Suction action is caused by connecting the aforementioned openings to an air-suction unit. The upper mold may have on its molding surface a cavity that forms an independent molding portion corresponding to a semiconductor element placement position on the semiconductor device. Furthermore, the lower mold also may have a cavity that forms an independent molding portion corresponding to a placement position of the optical semiconductor element on the semiconductor device. The upper mold is moveable in the vertical direction and is supported so that it is urged to the lower mold. An overflow cavity is formed on the molding surface of the lower mold for providing an overflow of the curable silicone composition from the sealing area during sealing of the optical semiconductor device. A gate or gates, which are communicated to the overflow cavity, and the sealing area may be formed on the clamping surface of the damper that applies a pressure to the semiconductor device.

When, in a semiconductor sealing operation, an unsealed optical semiconductor device is placed into the lower mold, a curable silicone composition is fed to a space between the upper and lower molds, the film peelable from the mold and the cured silicone body covers the surfaces of the sealing area, the optical semiconductor device is squeezed between the upper and lower molds together with the curable silicone composition and is sealed. Under these conditions, the damper that forms a frame that embraces the side surfaces of the sealing area of the upper mold freely moves in the vertical direction along the aforementioned side surfaces, projects with its lower end face below the molding surface of the upper mold, is urged to the lower mold, and seals the periphery of the sealing area; and while the lower and upper molds gradually approach each other, the curable silicone composition fills the sealing area, the molds stop in the closed position of the mold, and the semiconductor device is sealed by the curable silicone composition in the curing cavity of the mold.

FIG. 1 shows main structural parts of the compression molding machine suitable for carrying out the method of the invention. In this drawing, reference numeral 20 designates a fixed platen, and reference numeral 30 designates a movable platen. Both platens are incorporated into a press. The press may be comprised of an electrically driven press or a hydraulic press capable of performing a sealing operation by driving a movable platen in a vertical direction.

Reference numeral 22 designates a lower base that is fixed to the fixed platen 20, and 23 shows a lower mold that is fixed to the lower base 22. The upper surface of the lower mold 23 has a setting section for placing an optical semiconductor device 16. The optical semiconductor device 16 used in the method of the present invention may contain a plurality of optical semiconductor elements 10 installed on a printed circuit board 12 at equal distances from each other. The optical semiconductor device 16 faces upwardly from the lower mold 23. Reference numeral 24 designates a heater arranged in the lower base 22. The heater 24 is intended for heating the lower mold 23, and thus increases a temperature of the optical semiconductor device 16 supported by the lower mold 23. The machine is provided with lower clamp stoppers 26 that define a position in which the upper and lower molds have to be clamped. The clamp stoppers 26 are installed on the lower base 22.

Reference numeral 32 designates an upper base that is fixed to the movable plate 30. Reference numeral 33 is an upper holder fixed to the upper base 32, and 34 is an upper mold fixed to the upper holder 33. In the method of present embodiment, the optical semiconductor elements 10 are arranged and sealed on one side of the printed circuit board 12, which is flat. Therefore, in the sealing area the molding face of the upper mold 34 is also made flat. Reference numeral 36 designates a damper made in the form of a frame that encloses side faces of the upper mold 34 and the upper holder 33. The damper 36 is supported by the upper base 32 with free vertical movements and is biased towards the lower mold 23 by a spring 37. The molding face of the upper mold 34 is shifted from the end face of the damper 36, and a sealing area is formed in a closed state of the mold between the inner face of the damper 36 and the molding face of the upper mold 34. The biasing force of the damper 36 may be developed by means other than the spring, e.g., by a pneumatic cylinder.

Reference numeral 38 designates a heater that is arranged in the upper base 32 and is intended for heating the upper holder 33 and the upper mold 34, so that the optical semiconductor device 16 can be heated when the mold is closed; 39 designates upper clamp stoppers that are installed on the upper base 32. The upper clamp stoppers 39 and the lower clamp stoppers 26 are arranged on the side of the upper mold and on the side of the lower mold, respectively, so that in a closed state of the mold their end faces come into mutual contact. When the movable platen 30 is moved downward by the press unit, the upper clamp stoppers 39 contact the lower clamp stopper 26 in the clamping position. Depth of the curable silicone composition molding space is defined by the closed position of the mold. The aforementioned closed or claiming position defines the thickness of the sealing curable silicone composition layer formed in the sealing area.

Reference numeral 40a and 40b designate longitudinally arranged release films having width dimensions sufficient to cover the molding faces of the upper mold 34 and the lower mold 23, respectively. The purpose of the release films 40a and 40b is to cover the surfaces of the sealing area in order to prevent direct contact of the curable silicone composition with the molding surfaces. The release films 40a and 40b are made of a film-like material, which can be easily peelable from the mold and possesses thermal resistivity with regard to the molding temperatures, permanent mechanical strength, and sufficient softness for changing its shape in order to conform to the recesses and projections on the molding faces of the sealing area. Examples of such materials are films made from polytetrafluoroethylene (PTFE), ethylene-tetrafluoroethylene copolymer (ETFE), tetrafluoroethylene-perfluoropropylene copolymer (FEP), polyvinilidenefluoride (PBDF), or similar fluorine-containing resins; as well as polyethyleneterephthalate (PET), polypropylene (PP), etc.

When in the method of the invention sealing is performed only on the upper side of the printed circuit board 12, the release film 40a is supplied to the upper mold 34 for covering the surface that is to be in contact with the curable silicone composition. By feeding the release film 40b to cover the lower mold 23, it is possible to use compressibility and elasticity of the film for effectively absorbing deviations of the printed circuit board thickness from uniformity and thus to diminish non-uniformities in sealing. It should be noted, however, that the use only of the release film 40a that is located on the side of the upper mold 34 may be sufficient.

Reference numerals 42a and 42b designate feed rollers for the release films 40a and 40b, and reference numerals 44a, 44b designate take-up rollers for the films 40a and 40b, respectively. As shown in the drawing, the feed rollers 42a and 42b and the take-up rollers 44a and 44b are located on opposite sides of the molding machine. The feed roller 42a and the take-up roller 44a for the upper mold 34 are attached to the movable platen 30; the feed roller 42b and the take-up roller 44b for the lower mold 23 are attached to the fixed platen 20. With this structure, the release films 40a and 40b are moved through the mold from one side of the mold to the opposite side thereof. The feed roller 42a and the take-up roller 44a for the upper mold 34 are vertically moved together with the movable platen 30. Reference numeral 46 designates guide rollers, and 48 stands for static charge removers (ionizers), which remove electric charges on the peelable films 40a and 40b.

The release film 40a fed to the upper mold 34 is fixed onto the upper mold 34 and held by air suction. The damper 36 has air ports 36a, which are opened in the lower end face of the damper 36, and air ports 36b, which are opened in the inner side faces of the damper 36. The air ports 36a and 36b are communicated to the air suction mechanism locate outside of the mold. A seal ring (O-ring) is provided on the surface of the upper holder 33, which is in sliding contact with the inner surface of the damper 36. This seal ring prevents leakage of air from the air ports 36b when suction is activated. An air path is formed that flows through the space defined between the side faces of the upper mold 34, side faces of the upper holder 33, and inner faces of the damper 36, so that the air-suction action from the air port 36b holds the release film 40a on the inner faces of the molding area formed by the upper mold 34 and the clamper 36 and fixes the film to these faces. It should be noted that the suction unit connected to the air ports 36a and 36b is capable of developing not only a suction action but also of supplying a compressed air. When the compressed air is fed via the aforementioned ports, the film 40a is easily peeled from the molding faces.

A method of the invention for sealing the optical semiconductor device with a curable silicone composition will now be explained. In FIG. 1, the side on the left from a centerline CL shows an open state of the mold, in which the movable platen 30 is in the upper position. In this state, the release films 40a and 40b are newly fed onto surfaces of the mold, and then the optical semiconductor device 16 is set in the lower mold 23. The optical semiconductor device 16 is placed onto the release film 40b covering the surface of the lower mold 23.

In FIG. 1, the side on the right from the center line CL shows a state, in which the release film 40a is sucked and fixed to the upper mold 34 and the lower end face of the damper 36 by actuating the air suction unit. The release film 40a is fed close to the molding surface, and then the air is sucked through the air ports 36a and 36b. This action attracts the release film 40a to the end face of the damper 36 and fixes it to this end face. At the same time, the release film 40a is sucked along the inner faces of the damper 36 and the molding face 34b of the upper mold 34. As the release film 40a possesses sufficient softness and flexibility, due to the suction action, it follows the shape of recesses formed on the upper mold 34 and the damper 36. The end face of the damper 36 has a plurality of air ports 36a, which are arranged on the aforementioned face in the circumferential direction of the upper mold 34 with predetermined spaces from each other.

On one hand, the release film 40a is pressed by air suction against the upper mold 34, and at the same time, the curable silicone composition 50 is supplied to the printed circuit board 12 that supports the optical semiconductor device 16, which has been set in the lower mold 23. Since the amount of the curable silicone composition 50 that has to be supplied corresponds to capacity of the sealing area, it is recommended to supply the composition in metered quantities, e.g., with the use of a dispenser.

Figure 2:
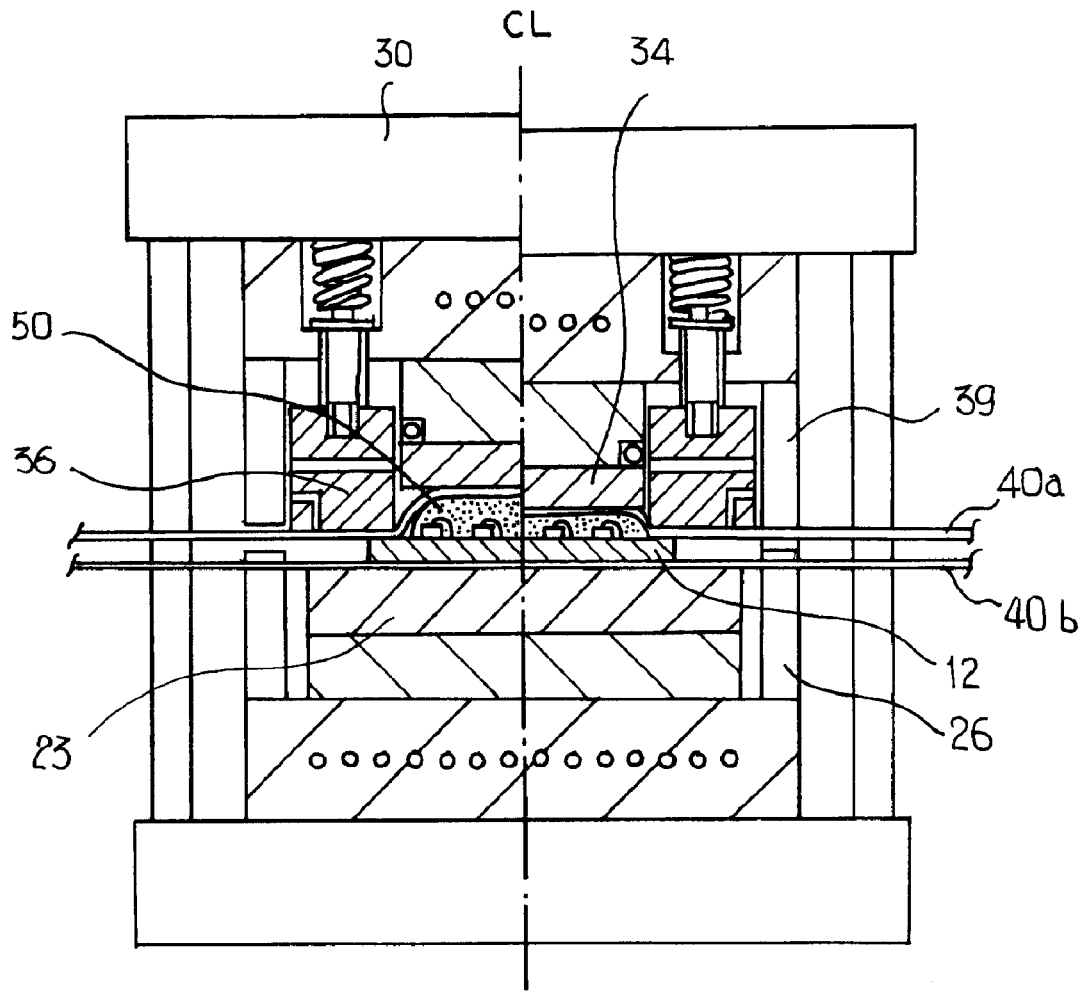
FIG. 2 illustrates sealing conditions of an optical semiconductor device sealed with the use of a compression molding machine utilized for realization of the method of the invention.

FIG. 2 shows the mold in a closed state when the optical semiconductor device 16 is clamped between the lower mold 23 and the upper mold 34. A part of the mold located on the left side from the center line CL shows a state, in which the upper mold 34 is moved downward, and the lower end face of the damper 36 is pressed against the printed circuit board 12 that supports the optical semiconductor device 16. The upper mold 34 does not reach the complete lowermost position. When the sealing space is closed by the damper 36, the curable liquid silicone composition 50 begins to fill the sealing space and is compressed by the upper mold 34. In FIG. 2, a part of the mold located on the right side from the centerline CL is shown in a state, in which the upper mold 34 is shifted downward to the clamping position. At the clamping position, the end faces of the lower clamp stoppers 26 come into contact with the end faces of the upper damper stoppers 39. The clamping force overcomes resistance of the springs 37 and moves the damper 36 upward, so that the curable silicone composition 50 in the sealing space can have a prescribed thickness.

When the upper mold 34 goes down to the clamping position and the sealing area is adjusted to a prescribed thickness, the curable silicone composition 50 completely fills the sealing area. As shown in FIG. 2, in the side of the machine on the left from the centerline CL, a small gap is formed between the corner portion of the upper mold 34 and the release film 40a. However, when the upper half-mold 34 descends to the clamping position, the gap between the upper mold 34 and the release film disappears, and the curable silicone composition 50 completely fills the sealing area.

Since the surface of the optical semiconductor device 16 that has to be sealed is clamped via the release film 40a and the periphery of the sealing area is reliably sealed by the damper 36, the sealing operation can be carried out without leakage of the curable silicone composition from the sealing area. In the case when wire patterns are formed on the upper face of the printed circuit board 12 with minute steps, the unevenness caused by such steps can be absorbed by the release film 40a, so that no curable silicone composition leaks from the sealing area when the optical semiconductor device 16 is clamped in the mold. The lower release film 40b that is applied onto the lower surface of the printed circuit board 12 also absorbs, due to its resiliency in the thickness direction, the unevenness of the thickness of the optical semiconductor device, so that the optical semiconductor device can be properly sealed.

After the curable silicone composition 50 is heated and cured in the closed state of the mold, the mold is opened, and the optical semiconductor device sealed with resin is removed from the mold. Since sealing was carried out over the release films 40a and 40b, the cured silicone body does not stick to the molding surfaces, since the release films 40a and 40b are easily peeled from the surfaces of the mold, so that the sealed optical semiconductor device can be easily extracted from the mold. As described above, separation of the release film 40a can be facilitated by blowing compressed air through the air ports 36a and 36b. After the mold is opened, the feed rollers 42a, 42b and the take-up rollers 44a and 44b are activated, and the release films 40a and 40b are removed from the mold together with the sealed semiconductor device.

Figure 3:
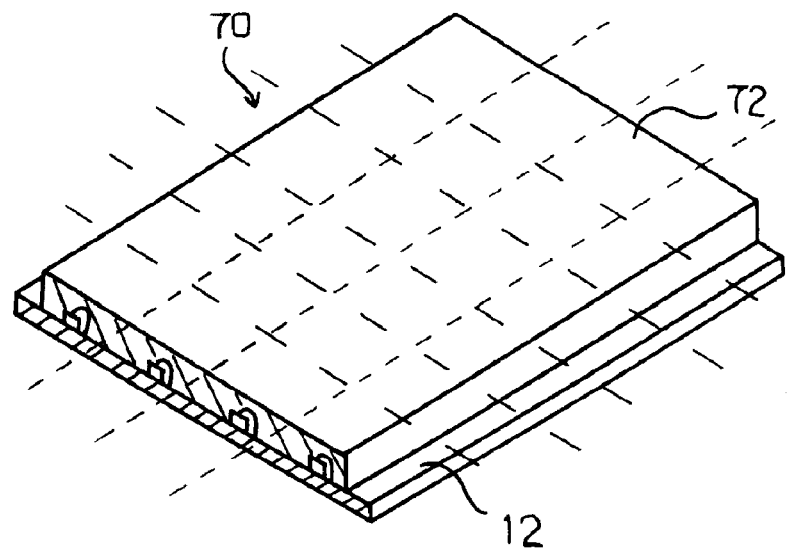
FIG. 3 is a three-dimensional view that shows lines of cutting for separation of the assembly into individual optical semiconductor devices of the invention.

FIG. 3 shows an optical semiconductor device sealed by the method of the present invention. Since the upper side of the molded portion is flat, the molding surface of the upper mold 34 also is flat. As shown in the drawings, the intermediate positions between the neighboring semiconductor chips 10 are intended for making a cut through the layer of the sealing resin and the printed circuit board for separating the sealed optical semiconductor devices into individual pieces. Cutting can be made by means of a dicing saw, laser cutting device, etc.

Figure 4:
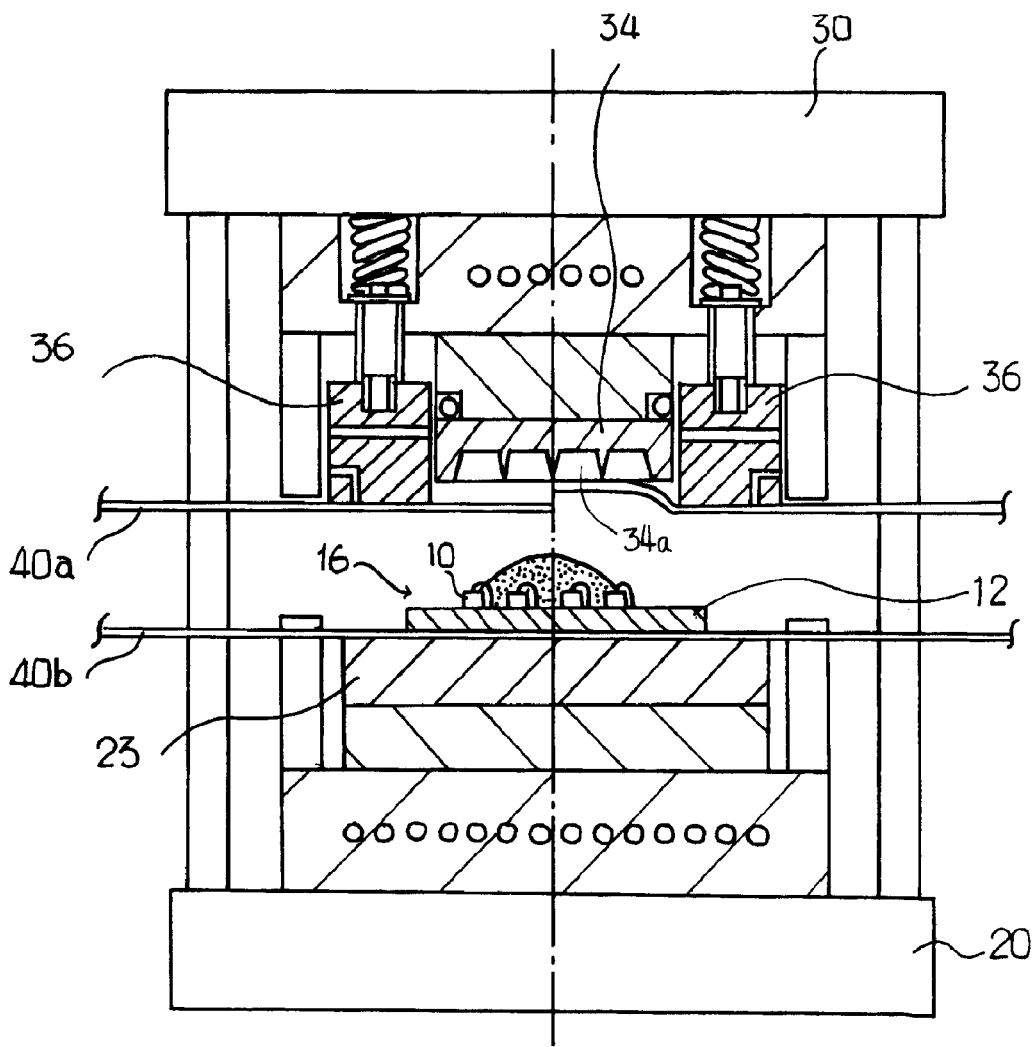
FIG. 4 illustrates another structure of the compression molding machine suitable for realization of the method of the invention.
Figure 5:
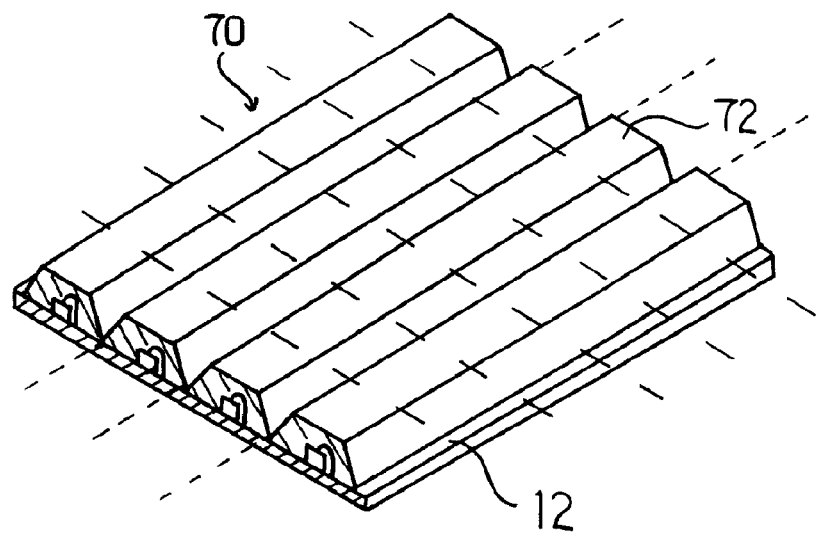
FIG. 5 is a three-dimensional view that shows lines of cutting for separation of the assembly into individual optical semiconductor devices of the invention.

Furthermore, as shown in FIG. 4, the molding face of the upper mold 34 may be provided with cavities 34a that correspond to the mounting positions of individual optical semiconductor elements 10, so that each element 10 is sealed individually in its respective cavity 34a. An optical semiconductor assembly 70 obtained by such a method and sealed by a cured silicone body 72 is shown in FIG. 5. Individually sealed optical semiconductor devices are obtained by cutting the assembly with neighboring elements 10 in central positions through the layer of the sealing resins and the printed circuit board. Cutting can be performed by means of a dicing saw, laser cutter, or the like.

There are no restrictions with regard to the curable silicone composition of the present invention, provided that this composition is transparent or semitransparent and that it is suitable for forming a cured silicone body in the aforementioned states. In order not to reduce brightness of light generated by an optical semiconductor element, it is recommended that a cured silicone body has transmittance of visible light (wavelength of 400 to 700 nm) of 90% or more. The aforementioned light transmittance may correspond to a 0.2 mm-thick sample obtained by curing the curable silicone composition, where the thickness of the cured body sample is defined the length of the optical path. However, light transmittance should be measured at 450 nm wavelength and a temperature of 25° C. When the curable silicone composition contains a luminescent component that subjects the light emitted by the optical semiconductor element to wavelength conversion, light transmittance of the cured silicone body that contains such a luminescence component may be 90% or less.

There are no special restrictions with regard to the mechanism of curing of the curable silicone composition, provided that it can be cured by compression molding. For example, this can be a hydrosilylation-curable silicone composition or a composition curable with the use of an organic peroxide. The hydrosilylation-curable silicone composition is preferable since it does not generate by-products during curing. For example, the following hydrosilylation-curable silicone composition can be used for forming a cured silicone body with an index of refraction of 1.45 or more at 25° C.:

(A) an organopolysiloxane represented by the following average unit formula:

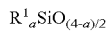

{where $R^1$ is a substituted or unsubstituted univalent hydrocarbon group with 1 to 10 carbon atoms with the proviso that 20 mole % or more of all $R^1$'s in one molecule are phenyl groups and at least two $R^1$'s are alkenyl groups; and "a" is a number that satisfies the e following condition: $0.5 \leq a \leq 2.2$};

(B) an organohydrogenpolysiloxane represented by the following average unit formula:

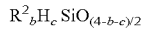

{where $R^2$ is a substituted or unsubstituted univalent hydrocarbon group with 1 to 10 carbon atoms with the exception of an alkenyl group, and both "b" and "c" are numbers that satisfy the following conditions: $1.0<b<2.2$; $0.002<c<1$; and $1.0<(b+c)<3.0$}; and (C) a hydrosilylation-reaction catalyst.

Component (A) that is represented by the following average unit formula:

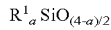

is one of main components of the aforementioned composition. This is an organopolysiloxane that contains at least two alkenyl groups in one molecule. In the above formula, $R^1$ designates a substituted or unsubstituted univalent hydrocarbon group with 1 to 10 carbon atoms, such as methyl, ethyl, propyl, isopropyl, butyl, isobutyl, t-butyl, pentyl, hexyl, cyclohexyl, heptyl, octyl, nonyl, decyl, or another alkyl group; vinyl, allyl, isopropenyl, butenyl, isobutenyl, hexenyl, cyclohexenyl, or another alkenyl group; phenyl, tolyl, xylyl, naphthyl, or another aryl group; benzyl, phenethyl, or another aralkyl group; 3-chloropropyl, 3,3,3-trifluoropropyl, or another halogenated substituted alkyl group. 20 mole % or more of all $R^1$s in one molecule are phenyl groups, and at least two of $R^1$s are alkenyl groups; "a" is a number that satisfies the following condition: $0.5 \leq a \leq 2.2$.

There are no special restrictions with regard to the molecular structure of aforementioned component (A) that may have a linear, partially-branched linear, branched, dendritic, or net-like molecular structure. From the point of view of improved physical properties, it is recommended that component (A) comprises a mixture of organopolysiloxanes ($A_1$) and ($A_2$), where ($A_1$) is an organopolysiloxane that has a viscosity of 10 to 10,000,000 mPa·s at 25° C. and is represented by the following average unit formula:

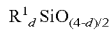

(where $R^1$ is the same as defined above, and "d" is a number that satisfies the following condition: $1.9 \leq d \leq 2.2$, and where ($A_2$) is an organopolysiloxane resin represented by the following average unit formula:

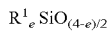

(where $R^1$ is the same as defined above, and "e" is a number that satisfies the following condition: $0.5 \leq e \leq 1.7$). The above mixture contains constituent ($A_1$) in an amount of 99 to 30 wt % and constituent ($A_2$) in an amount of 1 to 70 wt. %. Preferable proportions are the following: 90 to 40 wt. % of constituent ($A_1$) and 10 to 60 wt. % of constituent ($A_2$).

Constituent ($A_1$) has a linear or a partially branched linear structure and a viscosity of 10 to 10,000,000 mPa·s, preferably 100 to 1,000,000 mPa·s, and even more preferably, 100 to 100,000 mPa·s at 25° C. Constituent ($A_1$) may be represented by a methylphenylpolysiloxane capped at both molecular terminals with dimethylvinylsiloxy groups, a copolymer of a methylphenylsiloxane and dimethylsiloxane capped at both molecular terminals with dimethylvinylsiloxy groups, a copolymer of a methylvinylsiloxane and methylphenylsiloxane capped at both molecular terminals with dimethylvinylsiloxy groups, a copolymer of methylvinylsiloxane and diphenylsiloxane capped at both molecular terminals with dimethylvinylsiloxy groups, a copolymer of a methylvinylsiloxane, methylphenylsiloxane, and dimethylsiloxane capped at both molecular terminals with dimethylvinylsiloxy groups, a copolymer of a methylvinylsiloxane and methylphenylsiloxane capped at both molecular terminals with trimethylsiloxy groups, a copolymer of a methylvinylsiloxane and diphenylsiloxane capped at both molecular terminals with trimethylsiloxy groups, and a copolymer of a methylvinylsiloxane, methylphenylsiloxane, and dimethylsiloxane capped at both molecular terminals with trimethylsiloxy groups.

Constituent ($A_2$) may have a branched, dendritic, or a net-like molecular structure. This constituent may be in any state between liquid and solid at 25° C. Among the siloxane units represented by the following siloxane unit formulae: $R^1_3SiO_{1/2}$, $R^1_2SiO_{2/2}$, $R^1SiO_{3/2}$, and $SiO_{4/2}$, constituent ($A_2$) may consist only of siloxane units of formula $R^1SiO_{3/2}$, may comprise a combination of the siloxane unit of unit formulae: $R^1SiO_{3/2}$ with a siloxane unit represented by any other of the aforementioned formulae, or a combination of the siloxane unit of formula $SiO_{4/2}$ with a siloxane unit represented by any other of the aforementioned formulae. In order to reduce the amount of constituent ($A_2$) needed for use, it is recommended that a molecule of this constituent contain silanol groups and/or silicon-bonded alkoxy groups.

Component (B) is an organohydrogenpolysiloxane that is a curing agent of the aforementioned composition. It is represented by the following average unit formula:

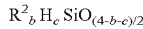

and contains at least two silicon-bonded hydrogen atoms in one molecule. In the above formula, $R^2$ is a substituted or unsubstituted univalent hydrocarbon group with 1 to 10 carbon atoms with the exception of an alkenyl group. Such a group can be represented by methyl, ethyl, propyl, isopropyl, butyl, isobutyl, t-butyl, pentyl, hexyl, cyclohexyl, heptyl, octyl, nonyl, decyl, or another alkyl group; phenyl, tolyl, xylyl, naphthyl, or another aryl group; benzyl, phenethyl, or another aralkyl group; 3-chloropropyl, 3,3,3-trifluoropropyl, or another halogenated substituted alkyl group. From the viewpoint of the improved light transmission at a high index of refraction, it is recommended that 20 mole % or more, preferably 25 mole % or more of all $R^2$'s in one molecule be phenyl groups. In the above formula, both "b" and "c" are numbers that satisfy the following conditions: $1.0<b<2.2$; $0.002<c<1$, and $1.0<(b+c)<3.0$. From the point of view of better reactivity to component (A), the following condition is recommended for "c": $0.02<c<1$.

There are no special restrictions with regard to the molecular structure of component (B) that may have a linear, partially branched linear, branched, dendritic, net-like, or cyclic structure. For better miscibility with component (A), component (B) should be liquid at 25° C. For example, its viscosity may be within the range of 1 to 1,000 mPa·s at 25° C. In order to provide good reactivity to component (A), viscosity of component (B) should be within the range of 1 to 50 mPa·s, preferably, 1 to 5 mPa·s. From this point of view, component (B) should have 3 to 500, preferably 3 to 10 silicon atoms in one molecule. There are no special restrictions with regard to positions where hydrogen atoms are bonded to silicon atoms in component (B). For example, such positions may be at molecular terminals and/or in side molecular chains.

It is recommended that in the composition of the invention component (B) be contained in such an amount that the mole ratio of silicon-bonded hydrogen atoms of component (B) to alkenyl groups of component (A) be close to 1, preferably between 0.3 and 5, and more preferably, between 0.6 and 3. It is difficult to express a weight ratio of component (B) in terms of its molecular weight and amount of silicon-bonded hydrogen atoms or in terms of molecular weight and amount of alkenyl groups of component (A), but, in general, component (B) should be added to the composition in an amount of 0.1 to 50 parts by weight per 100 parts by weight of component (A).

The hydrosilylation-reaction catalyst of component (C) is used to accelerate curing. This component may be exemplified by platinum black, chloroplatinic acid, alcohol modification product of chloroplatinic acid, olefin-platinum complex, complex of platinum and bis(acetoacetate), complex of platinum and bis(acetylacetonate), complex of platinum and 1,3-divinyl-1,1,3,3-tetramethyldisiloxane, or other alkenylsiloxane complexes, platinum-carbonyl complex, etc. Component (C) may also be comprised of a Wilkinson complex [chloro(tris(triphenylphosphine)rhodium], or similar rhodium catalysts or ruthenium catalysts. However, the platinum catalysts are preferable from the point of view of low cost. There are no special restrictions with regard to the amount in which component (C) can be added to the composition of the invention, provided that the added amount accelerates curing. For practical purposes, it can be recommended to add this component, in terms of weight of metallic platinum, in an amount of 0.1 to 2,000 ppm, preferably 0.1 to 200 ppm of per total weight of components (A) and (B).

In order to impart adhesive properties to a cured silicone body obtained by curing the composition of the invention, the composition can be combined with an adhesion promoting agent. Such an agent may comprise an organosilicon compound having at least one silicon-bonded hydrolysable group in one molecule, in particular an organosilicon compound having at least two hydrolysable groups bonded to the same silicon atom. Such hydrolysable groups can be exemplified by methoxy, ethoxy, propoxy, butoxy, methoxyethoxy, or similar alkoxy groups; acetoxy or similar acryloxy groups; isopropenoxy or similar alkenoxy groups; dimethylketoxime, methylethylketoxime, or similar oximes, of which alkoxy groups, particularly methoxy groups, are preferable. It is recommended to use adhesion promoting agents in the form of organosilicon compounds with trimethoxy groups. Silicon-bonded groups other than hydrolysable groups of organosilicon compounds may be represented by aforementioned substituted or unsubstituted univalent hydrocarbon groups, as well as by 3-glycidoxypropyl, 4-glycidoxybutyl or other glycidoxyalkyl groups; 2-(3,4-epoxycyclohexyl)ethyl, 3-(3,4-epoxycyclohexyl)propyl, or other epoxycyclohexylalkyl groups; 4-oxylanylbutyl, 8-oxylanyloctyl, or similar oxylanylalkyl group, or other epoxy-containing univalent organic groups; 3-methacryloxypropyl, or other acryl-containing univalent organic groups; as well as by hydrogen atoms. In order to provide adhesion to various substrates, it is recommended that the aforementioned organosilicon compounds contain a univalent organic group with at least one epoxy group in one molecule. Examples of such compounds are organosilane, organosiloxane, and silatrane. The aforementioned organosiloxane may have a linear, partially-branched linear, branched, cyclic, or net-like molecular structure, of which the linear, branched, and net-like molecular structures are preferable.

The aforementioned organosilicon compounds can be represented by 3-glycidoxypropyl trimethoxysilane, 2-(3,4-epoxycyclohexyl)ethyltrimethoxysilane, 3-methacryloxypropyl trimethoxysilane, or similar organosilanes; organosilane the molecule of which contains at least one silicon-bonded alkenyl group or a silicon-bonded hydrogen atom and silicon-bonded alkoxy group, a mixture of organosilane or organosiloxane having at least one silicon-bonded alkoxy group with organosiloxane the molecule of which contains at least one silicon-bonded hydroxy group and silicon-bonded alkenyl group, a siloxane compound represented by the following average structural formula:

[First Chemical Formula]

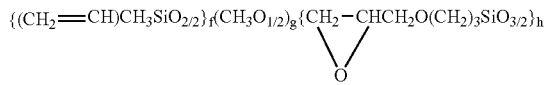

(where "f", "g", and "h" are positive numbers); and a siloxane compound represented by the following average structural formula:

[Second Chemical Formula]

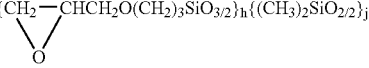

(where "f", "g", "h", and "j" are positive numbers).

There are no special restrictions with regard to an amount in which the adhesion promoting agent can be added to the composition, but in order to impart good adhesive properties to a cured silicone body obtained by curing the aforementioned composition, it is recommended to add the adhesion promoting agent in an amount of 0.01 to 20 parts by weight, preferably 0.1 to 10 parts by weight per 100 parts by weight of component (A). If the agent is added in an amount smaller than the recommended lower limit, the adhesive properties imparted to a cured silicone body will be insignificant. If, on the other hands, the agent is added in an amount exceeding the recommended upper limit, this will not further improve the adhesive properties but, on the contrary, will impair mechanical properties of the cured silicone body.

If necessary, for improving stability in storage and conditions of handling in production, the composition may incorporate 2-methyl-3-butyn-2-ol, 3,5-dimehyl-1-hexyn-3-ol, 2-phenyl-3-butyn-2-ol, or a similar acetylene-type compound; 3-methyl-3-penten-1-yne, 3.5-dimethyl-3-hexen-1-yne, or a similar enyne compound; 1,3,5,7-tetramethyl-1,3,5,7-tetravinyl cyclotetrasiloxane, 1,3,5,7-tetramethyl-1,3,5,7-tetrahexenyl cyclotetrasiloxane, methylvinylsiloxane capped at both molecular terminals with silanol groups, a copolymer of dimethylsiloxane and methylvinylsiloxane capped at both molecular terminals with silanol groups, or similar organosiloxane compounds having 5 wt. % or more of vinyl groups in one molecule; as well as benzotriazol or similar triazol compounds, phosphines, mercaptanes, hydrazines, or sirmilar curing inhibitors. Although there are no special restrictions with regard to the amount of the curing inhibitor that can be use in the composition, it is recommended to add this inhibitor in an amount of 0.001 to 6 parts by weight per 100 parts of the sum of components (A) and (B).

Within the limits that are not contradictory to) the object of the invention, the composition may incorporate various arbitrary components such as silica filler, quartz powder, titania, alumina powder, or other inorganic fillers; polymethacrylate resin, or similar organic fine-powder resins; pigments, heat-resistant agents, flame retarders, solvents, etc.

An example of an optical semiconductor device produced by the method of the present invention is a device shown in FIG. 3 that contains a printed circuit board and optical conductive elements electrically interconnected by wire bonding. The optical semiconductor device of FIG. 3 is produced by attaching the optical semiconductor elements 10 with the use of a die-bond agent to a metal lead frame, or to a printed circuit board 12 made from polyimide resin, epoxy resin, BT resin, or ceramic, and then electrically interconnecting the optical semiconductor element on the board 12 with the use of a gold or aluminum bonding wires. When the printed circuit board supports a plurality of optical semiconductor elements sealed on the printed circuit board simultaneously, upon completion of the operation the individual elements are separated by sawing, punching, etc.

When during sealing of an optical semiconductor device with a cured silicone body by the method of the invention in the above-described compression molding machine the curable silicone composition comes into direct contact with the mold, it leaves on the molding surfaces of the mold a slimy substance that adheres to these surfaces. Therefore, it is recommended to perform compression sealing via the aforementioned release films. The use of such films allows continuous sealing with resin, extends intervals between mold-cleaning operations, and thus increases production efficiency.

There are no special restrictions with regard to compression molding conditions, but in order to diminish development of stress in the printed circuit board and optical semiconductor elements, it is recommended that the heating temperature be within the range of 60 to 150° C. Furthermore, the cycle time can be shortened by preheating the mold. Although properties of the molded product depend on the type of the curable silicone composition used for the product, they can to some extent be controlled by applying the curable silicone composition dropwise onto the printed circuit board which is kept preheated in the lower mold.

The following description will relate to the optical semiconductor device of the present invention.

The optical semiconductor device of the invention is the one produced by the above-described method of the invention. Since the cured silicone body of such an optical semiconductor device is free of voids, the device does not have external defects and maintains high moisture-resistant properties. The optical semiconductor device of the invention can be produced with accurate control of the cured silicone thickness, is suitable for decrease in the overall dimensions of the electronic instrument that incorporate this device, and can be manufactured in a very thin form. Furthermore, the optical semiconductor devices sealed in a cured silicone body are not subject to breakage or undesired contact of bonding wires, reduce concentration of stress on optical semiconductor elements, and even after long use are not subject to discoloration or decrease in brightness of the emitted light that may be caused by separation of the coating layer. Therefore, these devices may be used in a wide range of fields that require high reliability. Examples of such optical electronic elements are LED's (light-emitting diodes), semiconductors that form light-emitting layers, such as InN, AlN, GaN, ZnSe, SiC, GaP, GaAs, GaAlAs, GaAlN, AlInGaP, InGaN, AlInGan, etc., deposited onto substrates by MO CVD or by growing from a liquid phase. In addition to LED's, the optical semiconductor devices of the invention may be exemplified by photo-couplers and CCD's.

EXAMPLES

The method of the invention for manufacturing optical semiconductor devices and optical semiconductor devices of the invention will now be described by way of practical and comparative examples. Curable silicone compositions and curable epoxy resin compositions used in the subsequent practical and comparative examples and methods used for measuring physical characteristics of these compositions are described below.

[Index of Refraction]

This characteristic was measured in curable silicone compositions and curable epoxy resin compositions with the use of an Abbe-type refractometer for visible light (589 nm) at 25° C.

[Light Transmission Characteristics]

A curable silicone composition was injected into a 0.2 mm gap between two glass plates and cured for 1 hour at 150° C., whereby a cured silicone sample cell (0.2 mm optical path) was prepared. A reference cell comprised a unit composed of two glass plates with a 0.2 mm gap filled with water. Light transmission characteristics of a cured silicone body were measured at 25° C. at the wavelength of 450 nm with the use of an automatic spectrophotometer capable of performing measurement at an arbitrary wavelength of visible light (in the range of 400 nm to 700 nm). Light transmission characteristics of a cured epoxy resin were measured in the same manner, except that a cured epoxy resin was used instead of the cured silicone and that this cured epoxy resin was obtained by curing a curable epoxy resin composition that was first heated for 1 hour at 150° C. and then cured by heating for 1 hour at 180° C.

[Hardness]

A cured silicone body was formed into a sheet by press forming the curable silicone composition for 1 hour at 150° C. Hardness was measured by Type A or Type D durometer according to JIS K 6253. Hardness was measured by the same method for a cured body of an epoxy resin, except that a cured epoxy resin was used instead of the cured silicone and that this cured epoxy resin was obtained by curing a curable epoxy resin composition that was first heated for 1 hour at 150° C. and then cured by heating for 1 hour at 180° C.

[Adhesive Properties]

A polytetrafluoroethylene resin spacer (10 mm wide, 20 mm long, and 1 mm thick) was sandwiched between two aluminum plates (25 mm wide, 75 mm long, and 1 mm thick), and then the gap between the two aluminum plates was filled with a curable silicone composition that was cured by heating for 1 hour at 150° C. As a result, an adhesion test specimen was prepared. This specimen was used for measuring adhesive strength by conducting tensile shearing adhesive strength test according to JIS K 6850. The test for an epoxy resin specimen was the same except that a curable epoxy resin composition that was first heated for 1 hour at 150° C. and then cured by heating for 1 hour at 180° C. was used for the preparation of the specimen instead of the curable silicone composition.

Reference Examples 1 through 3

Curable silicone compositions were prepared by mixing various components in the proportions shown in Table 1. Results of measurement of viscosities at 25° C., indices of refraction, transmission of light through cured silicone bodies, hardness, and adhesive characteristics are shown in Table 2.

Organopolysiloxane (A1) is a methylphenylpolysiloxane capped at both molecular terminals with dimethylvinylsiloxy groups, having a viscosity of 15,000 mPa·s and expressed by the following average formula:

$(CH_2=CH)(CH_3)_2SiO\{(CH_6H_5)(CH_3)SiO\}_{118}Si(CH_2=CH)(CH_3)_2$

{Average unit formula: $(CH_2=CH)_{0.02}(C_6H_5)_{0.98}(CH_3)_{1.02}SiO_{0.99}$; content of phenyl groups in silicon-bonded univalent hydrocarbon groups; 48.5 mole %}.

Organopolysiloxane (A2) is a toluene-soluble white solid organopolysiloxane that has a standard polystyrene-referenced weight-average molecular weight of 2,400 and that is expressed by the following average siloxane unit formula:

$(C_6H_5SiO_{3/2})_{0.75}\{(CH_2=CH)(CH_3)_2SiO_{1/2}\}_{0.25}$

{Average unit formula: $(CH_2=CH)_{0.25}(C_6H_5)_{0.75}(CH_3)_{0.50}SiO_{1.25}$; content of phenyl groups in silicon-bonded univalent hydrocarbon groups; 50.0 mole %}

Organopolysiloxane (A3) is an organopolysiloxane that has a viscosity of 150 mPa·s and is expressed by the following formula:

$\{(CH_2=CH)(CH_3)_2SiO\}_3SiOSi(C_6H_5)(CH_3)_2$ {Average unit formula: $(CH_2=CH)_{0.60}(C_6H_5)_{0.20}(CH_3)_{1.60}SiO_{0.80}$}

Organopolysiloxane (A4) is an organopolysiloxane that has a viscosity of 150 mPa·s and is expressed by the following formula:

$(CH_3SiO_{3/2})_{0.85}\{(CH_2=CH)(CH_3)_2SiO_{1/2}\}_{0.15}$ {Average unit formula: $(CH_2=CH)_{0.15}(CH_3)_{1.15}SiO_{1.35}$}

Organopolysiloxane (A5) is a dimethylpolysiloxane capped at both molecular terminals with dimethylvinylsiloxy groups, having a viscosity of 50,000 mPa·s and is expressed by the following formula:

$(CH_2=CH)(CH_3)_2SiO\{(CH_3)_2SiO\}_{718}Si(CH_2=CH)(CH_3)_2$ {Average unit formula: $(CH_2=CH)_{0.002}(CH_3)_{2.000}SiO_{0.999}$}

Organohydrogenpolysiloxane (B1) is an organohydrogenpolysiloxane that has a viscosity of 400 mPa·s and is expressed by the following formula:

$(C_6H_5SiO_{3/2})_{0.60}\{(CH_3)_2HSiO_{1/2}\}_{0.40}$ {Average unit formula: $(C_6H_5)_{0.60}(CH_3)_{0.80}H_{0.40}SiO_{1.10}$; content of phenyl groups in silicon-bonded univalent hydrocarbon groups; 42.9 mole %}.

Organohydrogen polysiloxane (B2) is a methylhydrogen polysiloxane that has both molecular terminals capped with trimethylsiloxy groups, that has a viscosity of 150 mPa·s and is expressed by the following formula:

$(CH_3)_3SiO\{(CH_3)HSiO\}_{35}Si(CH_3)_3$ {Average unit formula: $(CH_3)_{1.11}H_{0.95}SiO_{0.97}$}.

Hydrosilylation-reaction catalyst (C) is a 1,3-divinyl-1,1,3,3-tetramethyl disiloxane solution of a complex of platinum and 1,3-divinyl-1,1,3,3-tetramethyl disiloxane Adhesion promoting agent (D) is a siloxane compound represented by the following average structural formula:

[Third Chemical Formula]

$\{(CH_2=CH)CH_3SiO_{2/2}\}_3(CH_3O_{1/2})_5\{CH_2\!-\!\!\!\underset{O}{\underset{\diagdown\,\diagup}{}}\!\!\!CHCH_2O(CH_2)_3SiO_{3/2}\}_5\{(CH_3)_2SiO_{2/2}\}_{20}$ Curing inhibitor (E): 2-phenyl-3-butyn-2-ol

TABLE 1

| Components of Curable Silicone Compositions | | Ref. Ex. 1 | Ref. Ex. 2 | Ref. Ex. 3 |
|---|---|---|---|---|
| (A1) | (parts by weight) | 40.0 | — | — |
| (A2) | (parts by weight) | 25.0 | 45.0 | — |
| (A3) | (parts by weight) | — | 12.0 | — |
| (A4) | (parts by weight) | — | — | 35.0 |
| (A5) | (parts by weight) | — | — | 30.0 |
| (B1) | (parts by weight) | 35.0 | 45.0 | — |
| (B2) | (parts by weight) | — | — | 6.5 |
| (C) | (ppm*) | 0.1 | 0.1 | 0.1 |
| (D) | (parts by weight) | 1.0 | 1.0 | 1.0 |
| (E) | (parts by weight) | 0.01 | 0.01 | 0.01 |

*Amount of metallic platinum in the composition

Reference Example 4

A curable epoxy resin composition was prepared by mixing 59 parts by weight of EPIKOTE 828 (epoxy resin, a product of Yuka-Shell Epoxy Co., Ltd.), 41 parts by weight of NH-5500 (liquid acidic anhydride, a product of Hitachi Kasei Kogyo KK), and 0.6 parts by weight of DBU (1.8-diazabicyclo[5.4.0]undecen-7-ene). The obtained curable epoxy resin composition was tested with regard to its index of refraction and viscosity at 25° C., light transmission characteristics, hardness, and adhesive strength. The results are shown in Table 2.

TABLE 2

|  |  | Ref. Ex. 1 | Ref. Ex. 2 | Ref. Ex. 3 | Ref. Ex. 4 |
|---|---|---|---|---|---|
| Characteristics of the composition |  |  |  |  |  |
| Viscosity | (mPa·s) | 6500 | 4000 | 5000 | 1000 |
| Index of refraction |  | 1.53 | 1.54 | 1.41 | 1.53 |
| Characteristics of cured body |  |  |  |  |  |
| Light transmission | (%) | 98 | 98 | 97 | 80 |
| Type A durometer hardness |  | 85 | — | 75 | — |
| Type D durometer hardness |  | — | 60 | — | 70 |
| Adhesion to aluminum | (MPa) | 1.0 | 1.8 | 1.5 | 2.5 |

Practical Examples 1 through 3, Comparative Example 1

Optical semiconductor devices of the type shown in FIG. 3 were produced by using curable silicone compositions of Reference Examples 1 through 3 and a curable epoxy resin composition of Reference Example 4.

More specifically, prior to sealing, optical semiconductor devices were produced by die bonding optical semiconductor elements (LED elements) to electrodes on one side of a BT-resin substrate partially coated with silver, and then wire bonding them to electrodes located on the side of the substrate opposite to the aforementioned semiconductor elements. Twenty rows of identical devices with 20 devices in each row were arranged on one side of the same substrate (the substrate size: 100 mm×100 mm) prior to sealing the devices of all twenty rows on the same substrate. The optical semiconductor devices supported by the printed circuit board were coated at predetermined locations at room temperature with a total of 20 g of the curable silicone composition or curable epoxy resin composition, and then the coated printed circuit board was placed into the lower mold of the compression molding machine shown in FIG. 1. The upper and lower molds were closed (in order to protect the mold surfaces from contamination and to facilitate separation of the cured body of silicone composition or epoxy resin composition, the inner surface of the upper mold was coated with a peelable tetrafluoroethylene resin film attached thereto by air suction), the printed circuit board was clamped between the molds, and in this state compression molding was carried out for 10 min. at 150° C. under pressure of 10 kgf/cm$^2$ (in case of the curable epoxy resin, the operation was carried out for 30 min. at 150° C.). The sealed optical semiconductor devices were removed from the mold and heat treated in an oven for 1 hour at 150° C. (in case of the curable epoxy resin, heat treatment was carried out for 1 hour at 180° C.). The surface of the optical semiconductor elements of the treated optical semiconductor devices appeared to be sealed with 600 μm-thick layers of the cured silicone or cured epoxy resin. The curing layer surface was smooth, free of voids, had attractive appearance, and looked complete filled. The devices sealed with the silicone or epoxy resin and located on the common substrate were separated into individual sealed optical semiconductor devices by cutting the common substrate along the lines in the middle between the adjacent devices. Characteristics of the obtained optical semiconductor devices are shown in Table 3.

TABLE 3

|  | Pr. Ex. 1 | Pr. Ex. 2 | Pr. Ex. 3 | Comp. Ex. 1 |
|---|---|---|---|---|
| Initial brightness (*1) | 110 | 110 | 95 | 100 |
| Initial appearance | Transparent | Transparent | Transparent | Yellow transparent |
| Brightness (*2) after 500 hour exposure to light | 102 | 99 | 92 | 75 |
| Appearance after 500 hour exposure to light | Transparent | Transparent | Transparent | Brown transparent |

(1*): Relative values with brightness of the device of Comparative Example 1 assumed as 100%.
(2*): Relative values with the initial brightness of the device of Comparative Example 1 assumed as 100%.

INDUSTRIAL APPLICABILITY

The method of the invention for manufacturing optical semiconductor devices provides sealing of optical semiconductor devices in cured silicone bodies that are free of voids, allows control of the coating layer thickness, protects the bonding wires from breakage and accidental contact, reduces concentration of stress on the optical semiconductor elements, produces devices that have long service life, reduces discoloration and disconnection of the sealing resin from the optical semiconductor elements, and produces devices that have excellent reliability and are suitable for commercial production. Based on the above, it can be stated that the method of the invention is suitable for the manufacture of light-emitting diodes.

The invention claimed is:

1. A method of manufacturing an optical semiconductor device sealed in a transparent or semitransparent cured silicone body by placing an unsealed optical semiconductor device into a mold and subjecting a transparent or semitransparent curable silicone composition that fills the spaces between the mold and the unsealed semiconductor device to compression molding.

2. The method of claim 1, wherein after the optical semiconductor device is placed into a lower mold and the transparent or semitransparent curable silicone composition is fed into a space between an upper mold and the unsealed optical semiconductor device, the unsealed semiconductor device is clamped between the upper mold and the lower mold, and the curable silicone composition is subjected to compression molding.

3. The method of claim 1, wherein at least two optical semiconductor devices are sealed, and then the obtained sealed assembly is cut into separate sealed semiconductor devices.

4. The method of claim 1, wherein a release film is applied to the inner surface of the mold.

5. The method of claim 4, wherein the release film is held against the inner surface of the mold by air suction.

6. The method of claim 1, wherein the semiconductor device comprises optical semiconductor elements on a printed circuit board, the elements being electrically connected via bonding wires.

7. The method of claim 1, wherein the sealed optical semiconductor device is a light-emitting diode.

8. The method of claim 1, wherein the cured silicone body has visible light transmittance of 90% or more.

9. The method of claim 1, wherein the curable silicone composition is a hydrosilylation-curable silicone composition.

10. The method of claim 9, wherein the hydrosilylation-curable silicone composition comprises at least the following components:
   (A) an organopolysiloxane represented by the following average unit formula:

$$R^1_a SiO_{(4-a)/2}$$

where $R_1$ is a substituted or unsubstituted univalent hydrocarbon group with 1 to 10 carbon atoms, with the proviso that 20 mole % or more of all $R_1$'s in one molecule are phenyl groups and at least two $R_1$'s are alkenyl groups; and "a" is a number that satisfies the following condition: $0.5 \leq a \leq 2.2$;
   (B) an organohydrogenpolysiloxane represented by the following average unit formula:

$$R^2_b H_c SiO_{(4-b-c)/2}$$

where $R_2$ is a substituted or unsubstituted univalent hydrocarbon group with 1 to 10 carbon atoms with the exception of an alkenyl group, and both "b" and "c" are numbers that satisfy the following conditions: $1.0 < b < 2.2$; $0.002 < c < 1$; and $1.0 < (b+c) < 3.0$; and
   (C) a hydrosilylation-reaction catalyst.

11. A sealed optical semiconductor device produced by the method according to claim 1.

* * * * *

UNITED STATES PATENT AND TRADEMARK OFFICE
CERTIFICATE OF CORRECTION

PATENT NO. : 7,651,887 B2  Page 1 of 1
APPLICATION NO. : 11/575835
DATED : January 26, 2010
INVENTOR(S) : Yoshitsuga Morita et al.

It is certified that error appears in the above-identified patent and that said Letters Patent is hereby corrected as shown below:

Column 19, line 15, after "where" delete "$R_1$" and insert therein --$R^1$--.

Column 19, line 17, after "all" delete "$R_1$'s" and insert therein --$R^1$'s--.

Column 20, line 1, after "two" delete "$R_1$'s" and insert therein --$R^1$'s--.

Column 20, line 8, after "where" delete "$R_2$" and insert therein --$R^2$--.

Signed and Sealed this

Twenty-ninth Day of June, 2010

David J. Kappos
*Director of the United States Patent and Trademark Office*